United States Patent
Cunningham et al.

(10) Patent No.: US 9,105,548 B2
(45) Date of Patent: Aug. 11, 2015

(54) SPARSELY-BONDED CMOS HYBRID IMAGER

(75) Inventors: Thomas J. Cunningham, Pasadena, CA (US); Bruce R. Hancock, Altadena, CA (US); Chao Sun, San Marino, CA (US); Todd J. Jones, Altadena, CA (US); Matthew R. Dickie, Altadena, CA (US); Shouleh Nikzad, Valencia, CA (US); Michael E. Hoenk, Valencia, CA (US); Christopher J. Wrigley, La Crescenta, CA (US); Kenneth W. Newton, Castaic, CA (US); Bedabrata Pain, Los Angeles, CA (US)

(73) Assignee: California Institute of Technology, Pasadena, CA (US)

( * ) Notice: Subject to any disclaimer, the term of this patent is extended or adjusted under 35 U.S.C. 154(b) by 211 days.

(21) Appl. No.: 13/531,204

(22) Filed: Jun. 22, 2012

(65) Prior Publication Data

US 2013/0175430 A1 Jul. 11, 2013

Related U.S. Application Data

(60) Provisional application No. 61/499,786, filed on Jun. 22, 2011.

(51) Int. Cl.
*H01L 27/146* (2006.01)
*H04N 5/374* (2011.01)

(52) U.S. Cl.
CPC ...... *H01L 27/14643* (2013.01); *H01L 27/1469* (2013.01); *H01L 27/14634* (2013.01); *H04N 5/374* (2013.01); *H04N 5/3742* (2013.01); *H01L 27/14689* (2013.01)

(58) Field of Classification Search
CPC . H01L 31/0232; H01L 31/09; H01L 51/0059; H04N 3/155; H04N 5/335; G01J 1/44; H01J 40/14; H03K 17/785; H03K 17/7955; H04B 10/802
USPC .............. 250/208.1, 214 R, 551, 214.1; 257/292–294; 348/294–311
See application file for complete search history.

(56) References Cited

U.S. PATENT DOCUMENTS

| | | | | |
|---|---|---|---|---|
| 6,998,659 | B2 * | 2/2006 | Raynor | 257/292 |
| 7,211,848 | B2 * | 5/2007 | Rhodes | 257/292 |
| 7,605,440 | B2 * | 10/2009 | Altice | 257/462 |
| 2013/0126708 | A1 * | 5/2013 | Blanquart | 250/208.1 |

* cited by examiner

*Primary Examiner* — Georgia Y Epps
*Assistant Examiner* — Carolynn A Moore
(74) *Attorney, Agent, or Firm* — Gates & Cooper LLP

(57) ABSTRACT

A method and device for imaging or detecting electromagnetic radiation is provided. A device structure includes a first chip interconnected with a second chip. The first chip includes a detector array, wherein the detector array comprises a plurality of light sensors and one or more transistors. The second chip includes a Read Out Integrated Circuit (ROIC) that reads out, via the transistors, a signal produced by the light sensors. A number of interconnects between the ROIC and the detector array can be less than one per light sensor or pixel.

19 Claims, 11 Drawing Sheets

CONVENTIONAL HYBRID IMAGER ARCHITECTURE

SPARSELY-BONDED CMOS HYBRID IMAGER

CROSS-REFERENCE TO RELATED APPLICATIONS

This application claims the benefit under 35 U.S.C. Section 119(e) of the following co-pending and commonly-assigned U.S. provisional patent application(s), which is/are incorporated by reference herein:

Provisional Application Ser. No. 61/499,786, filed on Jun. 22, 2011, by Thomas J. Cunningham, Bruce R. Hancock, Chao Sun, Todd J. Jones, Matthew R. Dickie, Shouleh Nikzad, Michael E. Hoenk, Chris J. Wrigley, Kenneth W. Newton and Bedabrata Pain, entitled "SPARSELY-BONDED CMOS HYBRID IMAGER,".

STATEMENT REGARDING FEDERALLY SPONSORED RESEARCH AND DEVELOPMENT

The invention described herein was made in the performance of work under a NASA contract, and is subject to the provisions of Public Law 96-517 (35 USC 202) in which the Contractor has elected to retain title.

BACKGROUND OF THE INVENTION

1. Field of the Invention

The present invention relates generally to Imagers, and to a method of fabrication thereof.

2. Description of the Related Art

Visible light cameras contain optics that focus light to form a visible image on a focal plane. In an electronic camera, the image is converted into an analog or digital electrical signal by an electronic sensor chip.

The light sensitive area of the electronic sensor chips is divided into an array of picture elements, or pixels. Light falling on a pixel liberates electric charge which is then converted in to a signal voltage, which is proportional to the intensity of the light incident on that pixel. The signal voltage for each pixel is then rapidly read out in turn, producing a video or video-like signal that is representative of the image focused on the electronic sensor chip.

Monolithic sensor chips made out of semiconducting silicon are widely used as visible light sensors, for applications such as cell phone cameras and digital still cameras. The term "monolithic" means that the sensor chip is made from a single piece of silicon. In a monolithic imager, the light-sensitive photodiode is integrated into the same silicon as all the other electronics. Each photodiode is surrounded by several transistors that buffer the signal produced by the photodiode, and also allow the resetting and selection of the photodiode.

Together these transistors, and the integrated photodiode, form a pixel. An imaging array of a quarter of a million, to many million pixels, form the light sensitive part of the chip. The imaging array on the chip is then surrounded by signal processing and control electronics.

The silicon in a monolithic imager is typically several hundred micrometers thick, but only the top few micrometers is optically sensitive, with the remaining silicon substrate simply acting as a mechanical support and electrical ground plane. The light is brought in from the front, and passes through gaps in the metallization and transistor layers before it is absorbed in the silicon, liberating signal charge.

Some monolithic imagers are back-illuminated. Here, the imager is mounted such that it is mechanically supported from the front, and the thick, optically insensitive substrate is mechanically and chemically removed, leaving the back surface of the thin, optically sensitive silicon exposed. The imager is mounted with the back surface out, so that light is incident on the exposed back surface. Signal charge liberated by the light diffuses or drifts to the front surface where it is collected and converted to a signal voltage.

Visible hybrid imagers are sometimes used for scientific applications. Hybrid imagers consist of two chips connected together. Typically, one chip is the Detector Array, and it consists of an array of photodiodes only (with no transistors). The other chip is the Readout Integrated Circuit (ROIC), and it contains the pixel transistors, as well as all of the surrounding support electronics. The chips are arranged so that the electronics on each chip (the photodiodes on the Detector Array and the transistors on the ROIC) face each other. The diodes are then connected to the pixel transistors through a chip-to-chip interconnect, typically an indium "bump" on each chip that is cold welded together when the chips are forced together. This requires on interconnect for each pixel, or one million interconnects for a one million pixel array. The architecture for a hybrid visible imager 100 is illustrated in FIG. 1.

FIG. 1 illustrates a conventional hybrid imager architecture 100, wherein the Detector Array 102 chip contains only photodiodes 104 and no transistors 106, and the pixel transistors 106 are on the corresponding location on the ROIC 108 (which also contains the control and signal handling electronics, such as analog-to-digital converters (ADCs)). The transistors comprise buffer 110, select 112, and reset 114 transistors.

Because the electronics side of the detector array must face the ROIC, their front surface is covered. Therefore, hybrid imagers can only be back illuminated. The detector array can be thinned, as described above for monolithic imagers.

Alternatively, the detector array can be made from very lightly doped silicon, which allows optically generated charge to drift or diffuse through the thick silicon without recombining Detector arrays made from very lightly doped silicon can therefore be thick but still have good response.

All of these detector arrays have the control or signal handling electronics in the same plane as the pixel electronics, so they must surround the imaging array. This produces a "dead zone" of optically insensitive silicon if one attempts to make a large mosaic array by tiling smaller, individual chips.

In addition, hybrid arrays require extremely large numbers of interconnects.

SUMMARY OF THE INVENTION

One or more embodiments of the invention comprise a device or device structure (e.g., Imaging, Imager, or detector structure), comprising a first chip including a detector array, wherein the detector array includes a plurality of light (or electromagnetic radiation) sensors and one or more transistors. A second chip is interconnected with the first chip, wherein the second chip comprises an ROIC that reads out, via the transistors, one or more signals produced by the light sensors. A number of interconnects between the ROIC and the detector array can be less than one per light sensor.

The detector array can comprise a plurality of pixels, wherein each pixel includes one of the light sensors and the transistors comprising a buffer transistor, a select transistor, and a reset transistor. The detector array can comprise a plurality of pixels, wherein each pixel includes one of the light sensors and one or more of the transistors, the transistors provide multiplexing of the signals produced by the light sensors, and the number of interconnects is less than one per pixel.

The detector array can suppress or prevent collection of signal charge by the transistors prior to collection of the signal charge by the photodiodes.

The detector array can further comprise a p-type doped semiconductor and one or more p-type wells in the p-type doped semiconductor, wherein the p-type wells are more highly p-type doped than the surrounding p-type doped semiconductor and each of the transistors is formed in one of the p-type wells. A doping difference between the p-type well and the p-type epitaxial layer can create an electric field, at a junction between the p-type doped semiconductor and the p-well, that repels electrons created in the p-type doped semiconductor, preventing the electrons from being collected by n-type regions of the transistor.

One or more n-type wells can be in the p-type doped semiconductor, wherein each of the photodiodes is made from a photodiode junction between the p-type doped semiconductor and the n-type wells.

One or more $n^+$-type implants can be in the p-type doped semiconductor, wherein each of the photodiodes is made from a photodiode junction between the p-type doped semiconductor and one of the $n^+$-implants.

A pitch of the pixels can be smaller than a bond pitch of the interconnects.

The Imager Structure can form a Hybrid Imager, wherein the ROIC is behind the detector array so that virtually all of the exposed silicon in the detector array is optically active.

Accordingly, one or more embodiments of the present invention disclose a new type of sparsely-bonded hybrid technology. Similar to a conventional hybrid, one or more embodiments of the sparsely-bonded hybrid can comprise of a back-illuminated Detector Array interconnected to a ROIC.

However, in embodiments of the sparsely-bonded hybrid, the full pixel including the photodiode and the buffer, select, and reset transistors, are integrated onto the Detector Array (as opposed to the conventional technology where only the photodiodes are arrayed on the Detector Array chip, and the remainder of the pixel electronics are kept on the ROIC).

Furthermore, whereas the conventional hybrid requires one interconnect per pixel, or one million interconnects for a megapixel array, embodiments of the sparsely-bonded hybrid can only require one interconnection per column and two interconnections per row, or three thousand for a megapixel array. The control and signal handling on the ROIC can also be placed directly behind the Detector Array, instead of on the periphery. The result can be a compact, robust imaging technology.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

One or more embodiments of the invention describe a type of imager chip which could be used as the sensor in a digital camera. The imager can be a hybrid, that is, made from two interconnected chips, with one chip being a back-illuminated Detector Array that converts incoming light into an electronic signal, and the other chip being a Readout Integrated Circuit Chip (ROIC) that carries out the scanning and digitization to convert the electronic charge from each pixel in the array into a video or other signal representative of the image.

One or more embodiments of the invention provide an interconnection scheme between chips that is relatively sparse, requiring only connections per column and per row in the array, instead of for each pixel. This means that the hybrid can have thousands of interconnections for megapixel-size arrays, instead of millions as in a conventional hybrid.

However, other configurations can also be used. Other examples of configuration include, but are not limited to, two connections per column, or putting the row decoder on the detector array. The detector array can have transistors on it that enable at least some multiplexing, so that the number of connections is less than one per pixel.

One or more embodiments of the invention can also decouple the pixel size from the interconnect spacing.

These embodiments allow the Detector Array to have a large number of very small pixels, while the readout electronics are effectively folded back behind the imaging array so that virtually every square millimeter of exposed silicon is optically active. This enables very compact imaging systems, since no exposed area is required for the readout and signal handling electronics. It can also allow tiling, in order to build very large imagers.

Technical Description
Sparsely-Bonded Hybrid Technology

Figure 1:
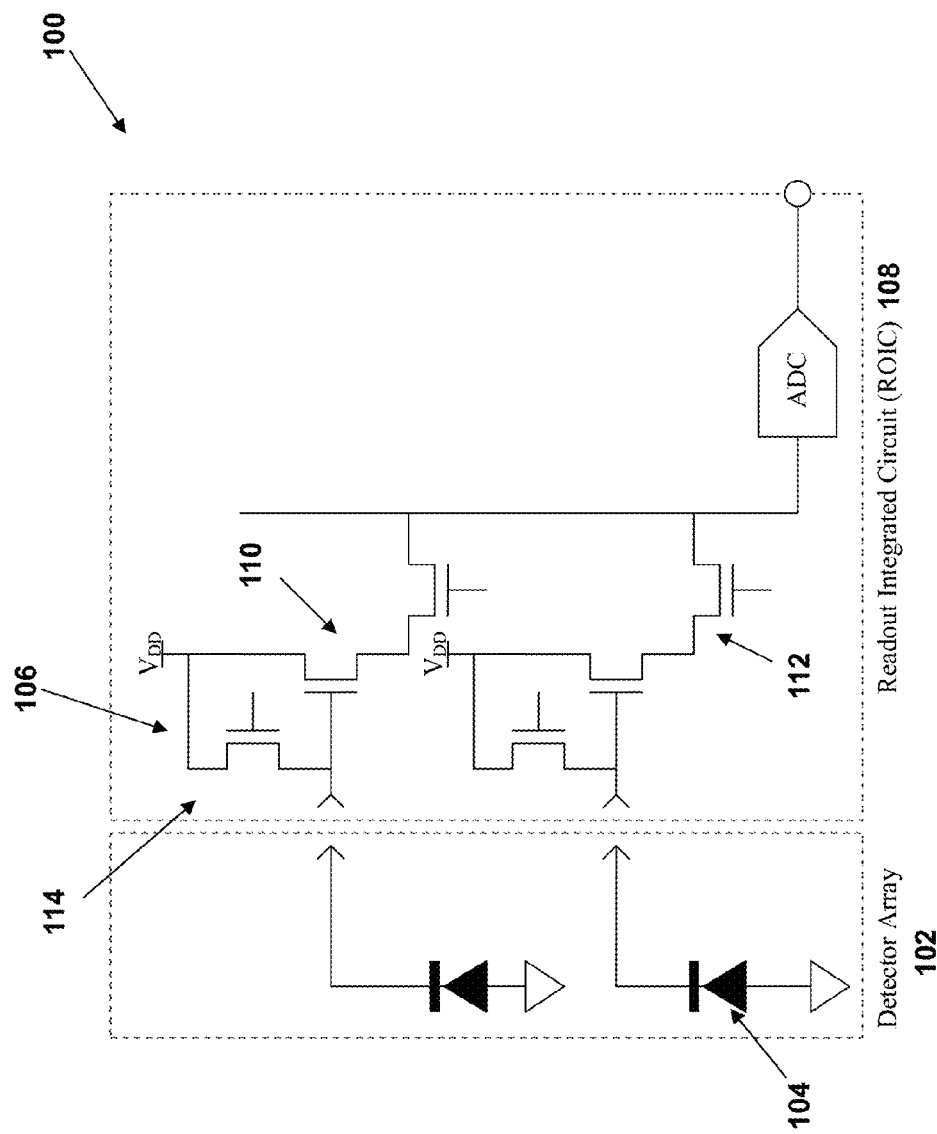
FIG. 1 illustrates a conventional hybrid imager architecture.
Figure 2:
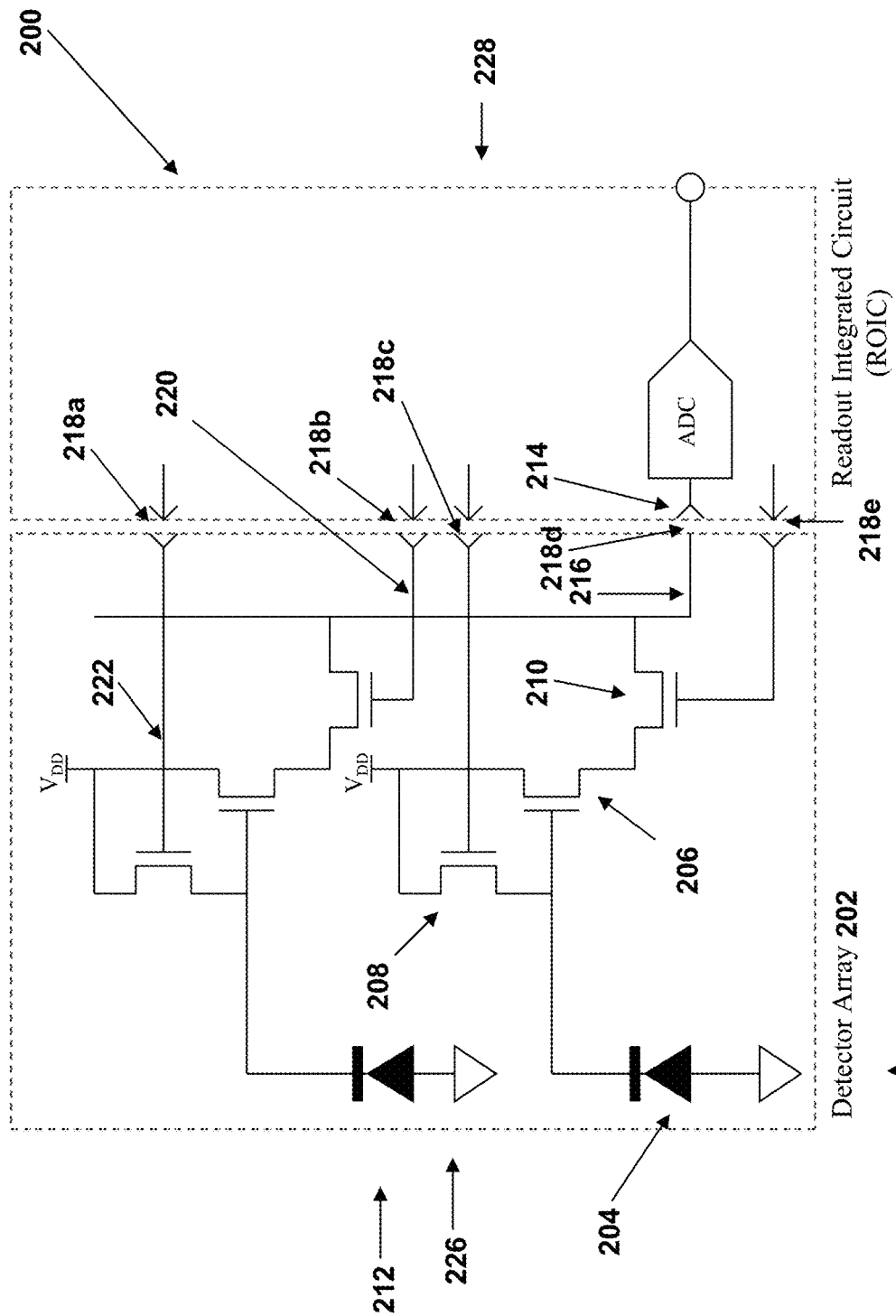
FIG. 2 illustrates the architecture of a sparsely-bonded hybrid technology, according to one or more embodiments of the invention, wherein the buffer, select, and reset transistors are integrated on-chip on the Detector Array with the photodiode, the ROIC contains the control and signal handling, and this architecture requires only one interconnection per column and two per row between the Detector Array and ROIC instead of one per pixel, which means that a million pixel array would require three thousand interconnects instead of one million.

One or more embodiments of the invention disclose a novel type of hybrid, utilizing a different interconnect architecture, as illustrated in FIG. 2.

The hybrid 200 still comprises or consists of a Detector Array 202 connected to an ROIC as in the conventional hybrid. However, the Detector Array 202 contains a full complementary-symmetry metal-oxide-semiconductor (CMOS) pixel, comprising a photodiode 204 integrated together with the buffering 206, reset 208, and select 210 transistors in the same silicon.

Placing the pixel transistors 206-210 on the Detector Array 202 allows the first level of multiplexing to be done on the Detector Array 202, that is, the output of the selected row 212 of pixels drives a common column output bus 214. The ROIC needs only to connect to the common column line 216, instead of to each pixel.

The ROIC must also drive the common row-based select 220 and reset 222 lines, so there are an additional two interconnections 218a, 218b per row 212 required.

The reset transistors 208 for pixels/photodiodes 204 in the same row can be connected to the same reset line 222 and connection 218a, and the select transistors 210 for pixels/photodiodes 204 in the same row can be connected to the same select line 220 and connection 218b. The select transistors 210 for transistors in the same column 224 can be connected to the same common column line 216.

Overall, this architecture requires then one connection 218d per column 224 and two connections 218a, 218b per row 212, instead of one per pixel or photodiode 204. A million pixel array would therefore only need three thousand interconnections 218a-e between the Detector Array 202 and the ROIC, instead of one million.

The present invention does not preclude other configurations. Other examples of configuration include, but are not limited to, two connections per column, or putting the row decoder on the detector array. In another embodiment, the detector array can have transistors 208 on it that enable at least some multiplexing, so that the number of connections 218a-e is less than one per pixel.

Because this architecture has many fewer interconnections 218a-e bonding the Detector Array 202 and the ROIC, the architecture is designated as a sparsely-bonded hybrid technology.

Because the imager 200 of FIG. 2 is a hybrid, the Detector Array 202 and the ROIC must still face each other, so that the Detector Array 202 must be back-illuminated. The back-illuminated Detector Array 202 can be thinned, or thick but very lightly doped, just as in the conventional hybrid.

The sparsely-bonded hybrid technology illustrated in FIG. 2 has several advantages over conventional hybrids or monolithic designs. As compared to a traditional hybrid, the many fewer bonds result in a likelihood of few broken bonds during fabrication, resulting in higher manufacturing yield. The bonds can also be larger, and set on a much larger pitch, which makes the fabrication of the bonds easier.

In one or more embodiments of the sparsely-bonded hybrid technology, the connections for the rows and columns (which are naturally two one-dimensional arrays) can be spread out into a single two-dimensional array of interconnects. This breaks the link between pixel pitch and bonding pitch. In a conventional hybrid, the pixels cannot be any smaller than the smallest bond pitch that can be practically fabricated. In the sparsely-bonded hybrid technology, the pitch of the pixel array can be much smaller than the bond pitch of the interconnect array.

In one or more embodiments of the invention, because the pixel transistors are integrated on the Detector Array, there is no need for an array of pixel transistors on the ROIC underneath the Detector Array. This leaves this area on the ROIC available for the control and signal processing circuitry, including the analog-to-digital converters. This circuitry is normally placed surrounding the imaging array, requiring the chip area to be significantly larger than the array area. Placing this circuitry behind the imaging array, instead of surrounding it, makes for a very compact imager. The complete chip can be not much larger than the imaging array, with almost all of the exposed surface area being sensitive to light. This also enables tiling of such arrays, since very little of the chip is optically inactive.

Fabrication Steps

One or more embodiments of a fabrication process are illustrated in FIGS. 3 through 9.

Transistor Integration

Integrating transistors alongside the detector array raises the possibility of a problem where the transistors collect and recombine signal charge before it can be collected by the photodiode. This would lower the sensitivity of the imager.

This problem can be avoided by proper placement of the photodiode with respect to the transistors.

Figure 3:
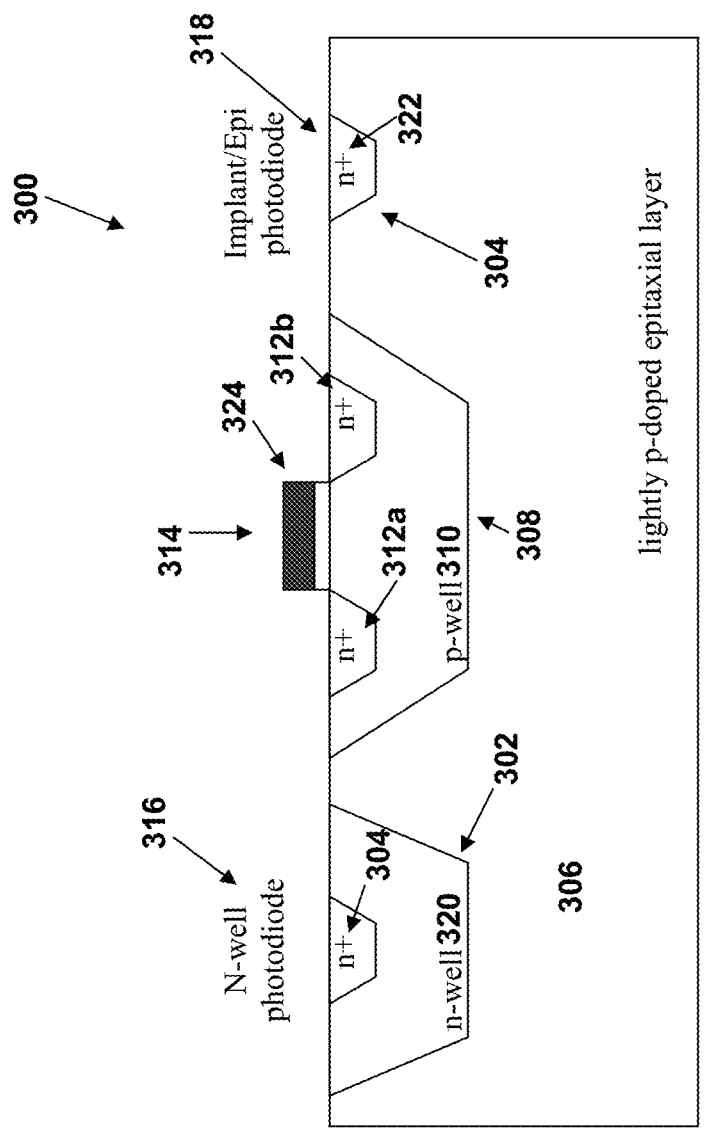
FIG. 3 illustrates a proper structure of pixels, according to one or more embodiments of the invention, wherein transistors should be placed in a p-well, the p-type well will repel signal electrons from the epitaxial layer so that they are not collected by the transistor source and drain, the photodiodes should be made so that the photodiode junction is between an n-well and the p epitaxial layer (as shown on the left), or directly between the $n^+$ implant and the p epitaxial layer (as shown on the right), but in no case should the $n^+$ contact for the diode be placed in a p-well.

FIG. 3 illustrates a proper structure of pixels 300, according to one or more embodiments of the invention, that can be used in the architecture illustrated in FIG. 2, for example.

FIG. 3 illustrates a pixel 300 of the Detector Array 202, wherein a photodiode junction 302, 304 should be against the relatively low doped p-type epitaxial layer 306, while the transistor junctions 308 should be placed in a p-well 310. The doping difference creates a slight electric field at the epitaxial layer 306/p-well 310 junction that tends to repel electrons created in the epitaxial layer 306, preventing the electrons from being collected by the n-type implant regions 312a, 312b of the transistor 314.

FIG. 3 illustrates two methods for forming the photodiode 316, 318: (1) photodiode 316 should either be made (1) from an n-well 320 against the p-epitaxial layer 306, or (2) by an intentional rule violation that produces an $n^+$ implant 322 outside any well 310.

In the first method, the p-type doped semiconductor layer 306 comprises one or more n-type wells 320, and the photodiode 316 is made from a junction 302 between the n-type well 320 and the p-type epitaxial layer 306.

In the second method, the p-type doped semiconductor layer 306 comprises one or more n-type implants 322, and the photodiode 318 is made from a junction 304 between the n-type implant 322 and the p-type epitaxial layer 306.

The transistor 314 can further comprise CMOS transistor, comprising a gate 324, and a source and drain formed by n-type regions 312a, 312b.

Thinning the Detector Array

If the detector array is thinned, it can be supported by a glass or quartz window. One method of achieving this is to frame the thin device. Starting with a wafer or wafer section as it comes from the foundry, which may be 300 to 700 micrometers thick, a well is etched into the silicon, stopping at the appropriate point. This can leave a silicon membrane 5 to 20 micrometers thick, surrounded and supported by the thick silicon frame. The frame supports the membrane during subsequent processing, such as passivating the etched surface.

Figure 4:
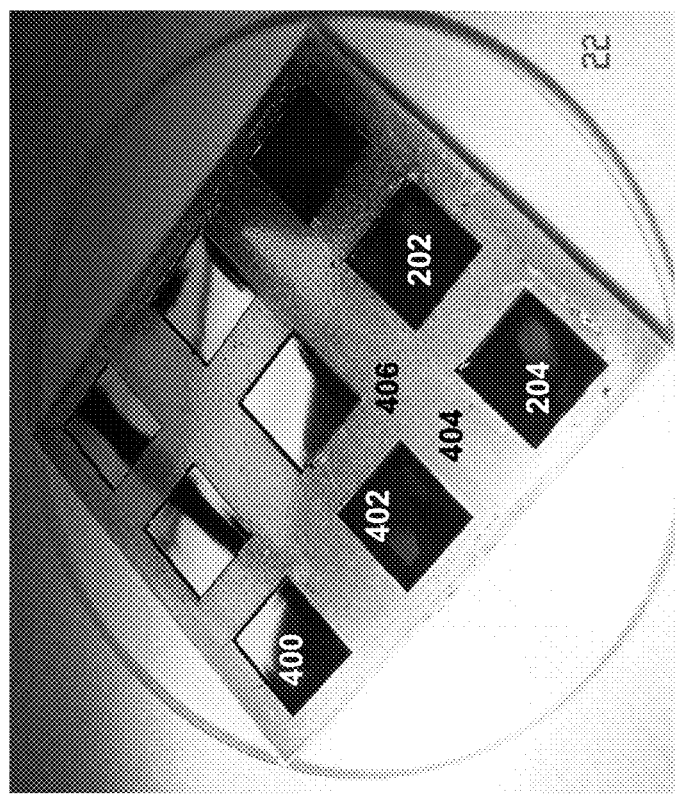
FIG. 4 illustrates frame thinning, according to one or more embodiments of the invention, showing a 3×3 array of thin membranes produced by simultaneously etching wells in the thick silicon substrate, and wherein the unetched areas form a relatively thick frame which supports the membranes so that they can be handled during the subsequent process steps.

FIG. 4 illustrates frame thinning, according to one or more embodiments of the invention, showing a 3×3 array of thin membranes 400 produced by simultaneously etching wells 402 in the thick silicon substrate 404, and wherein the unetched areas form a relatively thick frame 406 which supports the membranes 400 (comprising the detector array 202) so that they can be handled during the subsequent process steps.

Figure 5:
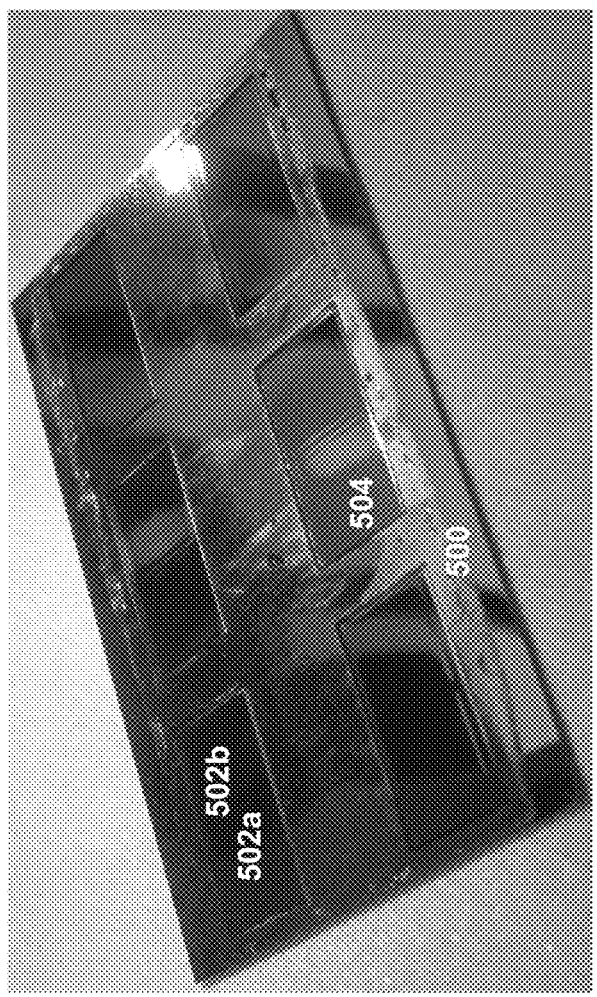
FIG. 5 illustrates an alternative frame, according to one or more embodiments of the invention, wherein there are two imagers in each well.

FIG. 5 illustrates an alternative frame 500, according to one or more embodiments of the invention, wherein there are two imagers 502a, 502b in each well 504.

Passivation

The passivation can be done by depositing heavily doped silicon by molecular beam epitaxy (MBE), a technique known as delta-doping. Alternatively, the passivation can be done by chemical means, or by a shallow ion-implant followed by a laser or other flash annealing.

Optical Flat Attachment

Once the imager is passivated, a glass optical flat can be glued down in the well 402. Once attached, the relatively thick glass supports the membrane 400 so the frame 406 is no longer needed. The frame 406 can then be sawed away, leaving the thin silicon membrane 400 supported by the glass.

Figure 6A:
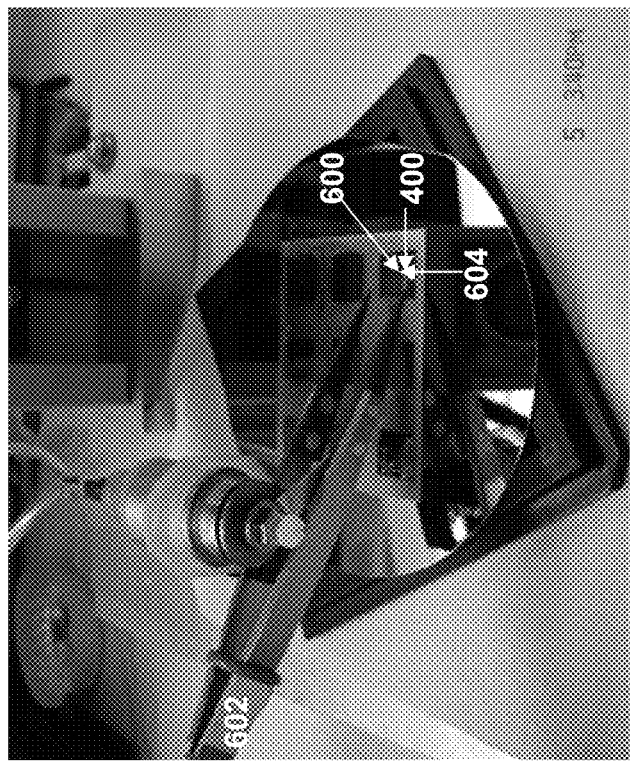
FIG. 6a illustrates optical flat placement, according to one or more embodiments of the invention, wherein a set of automated tweezers are used to place a glass optical flat over the thinned membrane and once the optical flat is glued into place, it supports the membrane.

FIG. 6a illustrates optical flat placement 600, according to one or more embodiments of the invention, wherein a set of automated tweezers 602 are used to place a glass optical flat 604 over the thinned membrane 400, and once the optical flat 604 is glued into place, it supports the membrane 400.

Figure 6B:
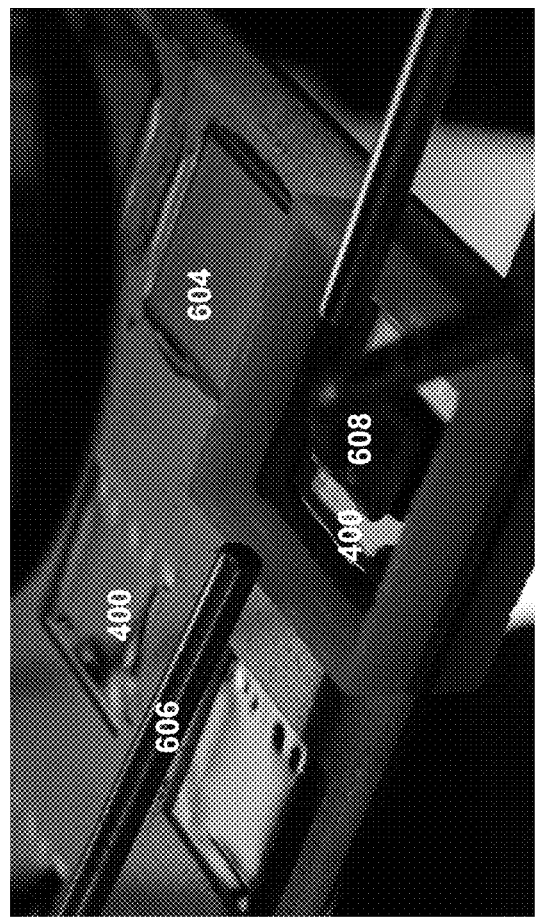
FIG. 6b illustrates optical flat attachment, according to one or more embodiments of the invention, wherein once dropped into place, the optical flat is pressed down against the membrane using a small metal rod, with the force distributed by a rubber pad.

FIG. 6b illustrates optical flat 604 attachment, according to one or more embodiments of the invention, wherein once dropped into place, the optical flat 604 is pressed down against the membrane 400 using a small metal rod 606, with the force distributed by a rubber pad 608.

Interconnect Deposition

Indium interconnects can then be deposited by evaporation, normally with a set of barrier metals (under-bump metallization or UBM) between the indium bump and the aluminum pad to prevent inter-diffusion of the metals. Indium bumps are deposited on both the Detector Array and the ROIC, then the two are aligned and pressed together to form a hybrid.

Figure 7:
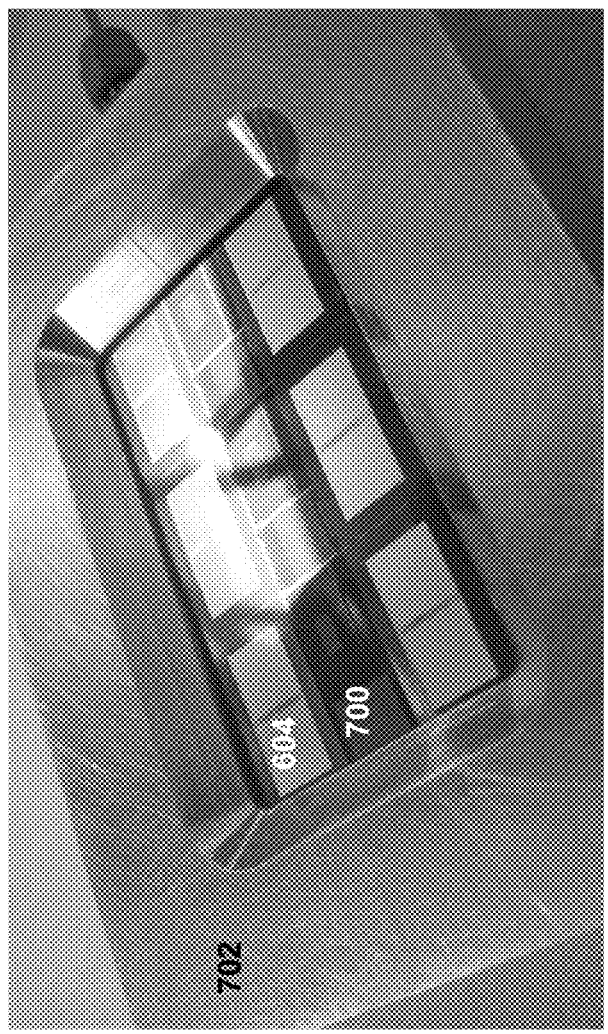
FIG. 7 illustrates indium bump deposition, according to one or more embodiments of the invention, showing a wafer section mounted in a jig for holding the wafer section in the indium evaporator after indium bumps have been deposited.

FIG. 7 illustrates indium bump deposition, according to one or more embodiments of the invention, showing a wafer section 700 mounted in a jig 702 for holding the wafer section 700 in the indium evaporator after indium bumps have been deposited.

Figure 8:
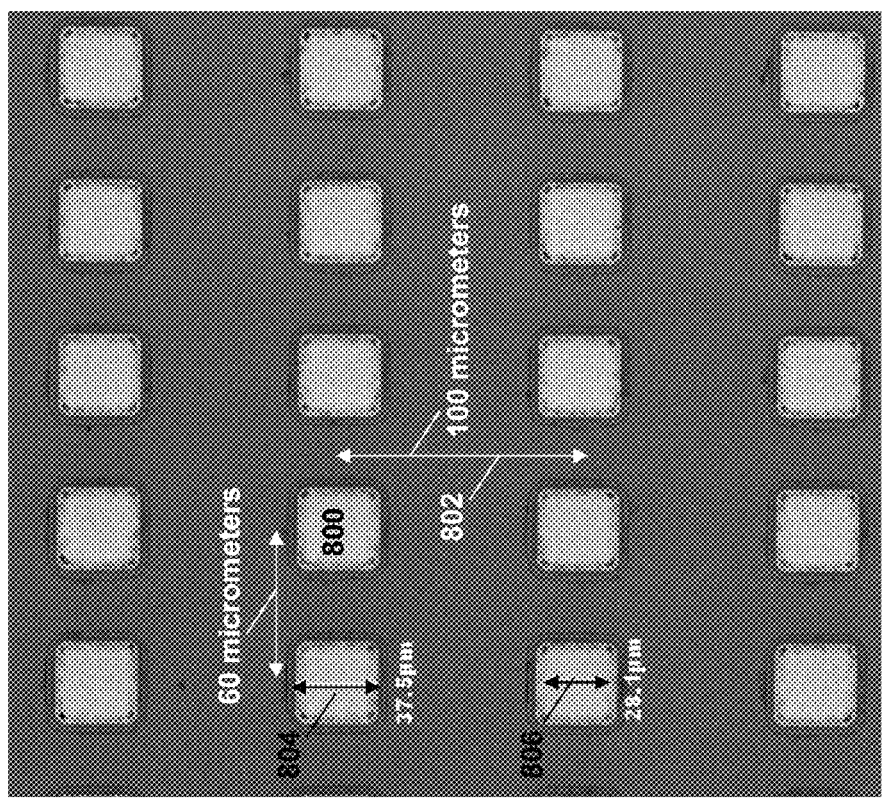
FIG. 8 illustrates interconnect pads, according to one or more embodiments of the invention, showing the bond pads used for hybridizing the Detector Array to the ROIC, wherein the pads are shown with the underbump metallization, but before the indium is deposited, and the pad pitch is 60 μm horizontally and 100 μm vertically.

FIG. 8 illustrates interconnect pads 800, according to one or more embodiments of the invention, showing the bond pads 800 used for hybridizing the Detector Array to the ROIC, wherein the pads 800 are shown with the underbump metallization, but before the indium is deposited, and the pad pitch 802 is 60 µm horizontally and 100 µm vertically, and the bond pads have a lengths 804, 806 of 28.1 µm and 37.5 µm.

Once the hybridization is complete, epoxy can be wicked between the Detector Array and the ROIC to add mechanical strength.

Figure 9:
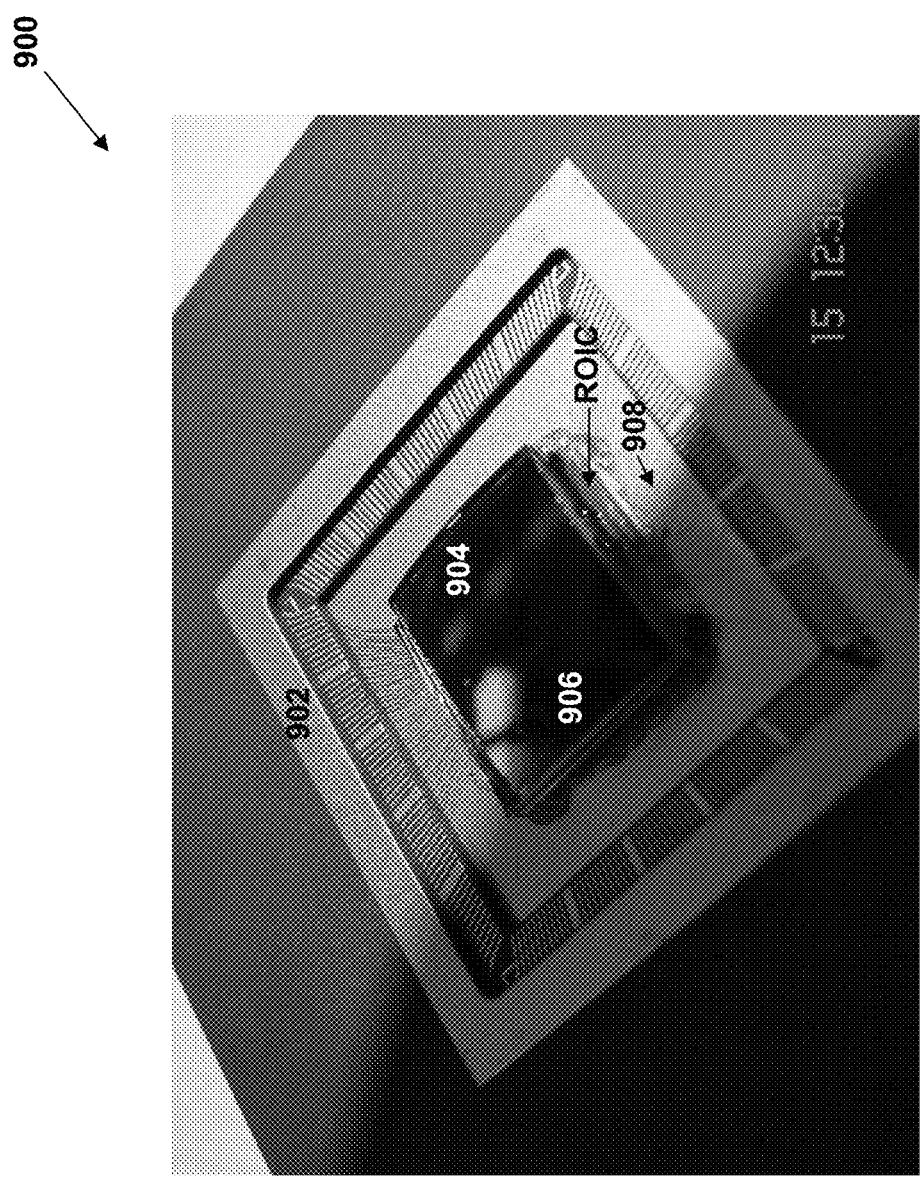
FIG. 9 illustrates a completed sparsely-bonded hybrid, according to one or more embodiments of the invention, showing a completed hybrid mounted in a large ceramic pin-grid-array package for test.

FIG. 9 illustrates a completed sparsely-bonded hybrid 900, according to one or more embodiments of the invention, showing a completed hybrid mounted in a large ceramic pin-grid-array package 902 for test. The optical flat 604 with a curved immersion lens 904 glued directly onto it are the top most layers. The detector array 906, 202 is directly underneath, but with the optically sensitive back surface facing up, so that it appears as simply a uniform dark surface underneath the glass. The ROIC is largely covered by the Detector Array 906 and glass, but peeks out at the upper left and lower right diagonals, where the thin wirebonds 908 attach.

Process Steps

Figure 10:
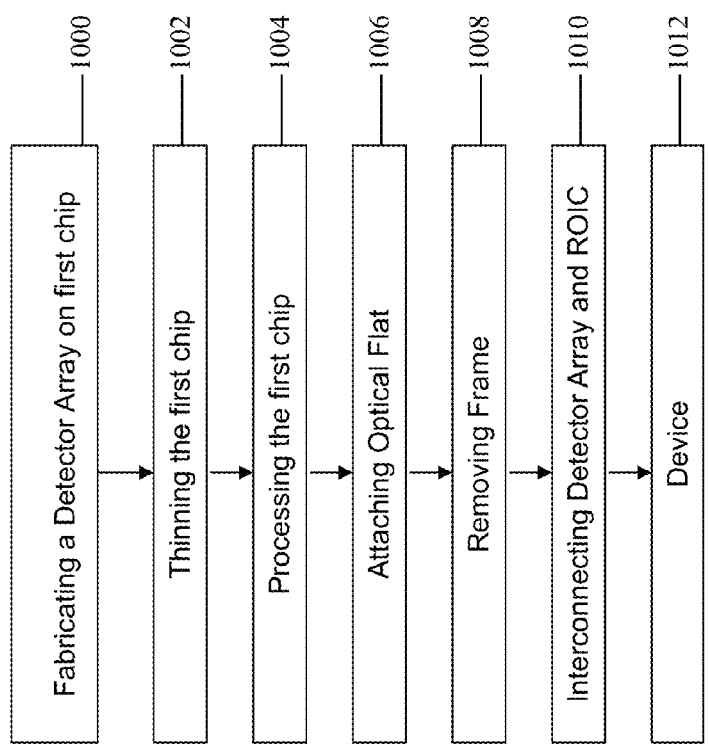
FIG. 10 illustrates a method of fabricating an imager structure according to one or more embodiments of the invention.

FIG. 10, together with FIGS. 2-9, illustrate an Imager Structure (e.g., Hybrid Imager) and method of fabricating the Imager Structure, according to one or more embodiments of the invention.

Block 1000 represents fabricating a first chip 226 (e.g., integrated circuit chip formed in silicon) comprising a detector array 202, wherein the detector array 202 comprises a plurality of light sensors (e.g., photodiodes 316, 204, photodetectors) and one or more transistors 314, 208.

The detector array can have transistors 314, 208 on it that enable at least some multiplexing (e.g., the transistors 314, 208 can provide multiplexing of the signals produced by the light sensors 204), so that the number of connections 218a-e with the ROIC is less than one per pixel 300.

The step may comprise disposing the light sensors 204 in rows 212 and columns 224 in the detector array 202. Fabricating the detector array 202 can comprise forming a plurality of pixels 300, wherein each pixel 300 includes one of the light sensors 204, 316 and one or more transistors 314 (e.g., a buffer transistor 206, a select transistor 210, and a reset transistor 208.

The detector array 202 may be fabricated to suppress or prevent collection of signal charge by the transistors 314 prior to collection of the signal charge by the photodiodes 316.

Fabricating the detector array pixels 300 may further comprise fabricating one or more of p-type wells 310 in the p-type doped semiconductor 306 (e.g., silicon), wherein the p-type wells 310 are more highly p-type doped than the surrounding p-type doped semiconductor 306, and each of the transistors 314 is formed in one of the p-type wells 310. A doping difference between the p-type well 310 and the p-type epitaxial layer 306 can create an electric field at a junction 308 between the p-type doped semiconductor 306 and the p-well 310 that repels electrons created in the p-type doped semiconductor 306, preventing the electrons from being collected by n-type regions 312a, 312b of the transistor 314.

The step may comprise fabricating one or more n-type wells 320 in the p-type doped semiconductor 306; wherein each/one or more of the photodiodes 204, 316 is made from a photodiode junction 302 between the p-type doped semiconductor 306 and the n-type wells 320.

The step may comprise fabricating one or more $n^+$-type implants 322 in the p-type doped semiconductor 306, wherein each/one or more of the photodiodes 318, 204 is made from a photodiode junction 304 between the p-type doped semiconductor 306 and one of the $n^+$-implants 322.

The step may comprise fabricating a pitch of the pixels that is smaller than a bond pitch 802 of the interconnects 218a-e.

Block 1002 represents thinning the chip 226 comprising the detector array 202, by etching a well 402 into silicon 404, to form a silicon membrane 400 surrounded by a thicker silicon frame 406, wherein silicon frame 406 supports the membrane during subsequent processing.

Block 1004 represents processing the chip 400, e.g., passivating the etched surface of the well 402.

Block 1006 represents attaching an optical flat 604 onto the well's 402 surface. The first chip 226 can then comprise a passivated membrane 400 supported by an optical flat 604.

Block 1008 represents removing the frame 406, leaving the membrane 400 supported by the optical flat 604.

Block 1010 represents interconnecting a second chip 228 with the first chip 226, wherein the second chip 228 (e.g., formed in silicon) comprises the ROIC that reads out, via the transistors 314, one or more signals produced by the light sensors 316. A number of interconnects 218a-e between the ROIC and the detector array 202 can be less than one per light sensor 316 or pixel 300. The number of interconnects 218a-e that is less than one per pixel 300 can be provided by proper positioning of the transistors 314 and light sensors in Block 1000.

In one embodiment, light sensors 204, or pixels 300 comprising the light sensors 204 and transistors 208, are disposed in rows and columns in the detector array such that the number of interconnects is one per column and two per row. However, different configurations are also possible. Other examples of configuration include, but are not limited to, two connections per column, or putting the row decoder on the detector array. In another embodiment, the detector array can have transistors 314, 208 on it that enable at least some multiplexing (e.g., the transistors can provide multiplexing of the signals produced by the light sensors), so that the number of connections with the ROIC is less than one per pixel.

The detector array 202 may be formed, and the ROIC may be positioned, such that the ROIC is behind the detector array 202 and virtually all of the exposed silicon in the detector array 202 is optically active, wherein the Imager Structure forms a Hybrid Imager.

The interconnects 218a-e can comprise indium bump bonds with barrier metals to prevent inter-diffusion of metals. The step may comprise depositing indium interconnects on the detector array 202 and the ROIC; aligning the detector array 202 and the ROIC; and pressing the detector array 202 and the ROIC together to form the Hybrid Imager.

While indium bumps can be used to connect the Detector Array to the Readout, different interconnect schemes can also be used. For example, indium bump interconnects can be replaced with a type of interconnect called wafer diffusion bonding.

Block 1012 represents the end result, a device such as the hybrid imager illustrated in FIG. 9.

Examples of Applications
Very Compact Imagers

Existing compact imagers are small monolithic silicon arrays. In a monolithic silicon array, the control and signal handling electronics are in the same plane as the pixel array, and these electronics surround the array, taking up chip area.

One or more embodiments of the spare bonding technology allow these electronics to be moved behind the pixel array, so that either the hybrid can fit into a smaller foot print, or else more pixels can be fitted in the same footprint. The sparsely-bonded hybrid can make considerably better use of the available area. Examples of applications for compact imagers include endoscope cameras, ultra-small cameras for bird-sized UAVs, etc.

Scientific Hybrid Imagers

Existing scientific hybrid imagers (e.g., by Teledyne Scientific Imaging (TSI) and Raytheon Vision Systems (RVS)) include hybrid imagers where the detector array has only photodiodes on it, requiring one interconnect per pixel instead of one per row and column. This means millions of interconnects in the existing technology instead of thousands. One or more embodiments of the invention, on the other hand, would be less expensive than the existing hybridization technology.

Focal Plane Arrays

One or more embodiments of the present invention can make extremely large focal plane arrays and offer a number of advantages over existing technology. Existing technology has at least two problems.

First, as the imager size goes up, the metal lines get longer, which increases both their resistance and capacitance. This makes it harder and harder to drive voltages across a very large array, so the speed goes down and power goes up as the imager gets bigger.

An even more serious problem is the yield. A single defect within a chip will often cause it to fail completely, and statistically there tend to be some set number of defects per unit area on the wafer. As a chip gets larger, the chance that it will be defect free can get extremely small, so the yield of very large focal planes can get very small, and one has to make hundreds of wafer starts just to yield a few good devices.

One or more embodiments of the invention avoid both problems, by allowing a very large monolithic detector array to be fabricated, but with the signal read out through interconnects to many small readout chips that are tiled onto the back of the detector array. The signals now run largely vertically, eliminating the need for very long horizontal metal runs. In addition, a defect in the detector array should cause the loss of only pixels or a small cluster of pixels, so defects would not take out an entire sensor. The readout chips can be small, so they can have high yield, and they can be tested beforehand, allowing the array to be made of a known good die.

CONCLUSION

This concludes the description of the preferred embodiments of the invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A device structure, comprising:
 a first chip comprising a detector array, the detector array comprising a plurality of pixels disposed in rows and columns, each of the pixels including a light sensor and transistors, and the transistors comprising a buffer transistor, a select transistor, and a reset transistor;
 interconnects having a number corresponding to less than one of the interconnects per light sensor, including:
   one or more reset interconnects including one reset interconnect per row of pixels, wherein the reset transistors in a same row are connected to a same one of the reset interconnects;
   one or more select interconnects including one select interconnect per row of pixels, wherein the select transistors in a same row are connected to a same one of the select interconnects;
   one or more common column interconnects including one common column interconnect per column of pixels, wherein one or more outputs of the select transistors in a same column are connected to a same one of the common column interconnects; and a second chip interconnected with the first chip, wherein:
the interconnects interconnect the second chip with the first chip; and
the second chip comprises a Read Out Integrated Circuit (ROIC) that reads out one or more signals produced by the light sensors.

2. The device structure of claim 1, wherein the first chip provides at least some multiplexing of the signals to create a multiplexed signal and the ROIC processes the multiplexed signal.

3. The device structure of claim 1, wherein the device structure is an imager.

4. The device structure of claim 1, wherein the detector array suppresses or prevents collection of signal charge by the transistors prior to collection of the signal charge by the light sensors.

5. The device structure of claim 1, wherein the detector array further comprises:
a p-type doped semiconductor; and
one or more of p-type wells in the p-type doped semiconductor, wherein:
the p-type wells are more highly p-type doped than the surrounding p-type doped semiconductor; and
each of the transistors is formed in one of the p-type wells.

6. The device structure of claim 5, wherein the light sensors are photodiodes and the detector array further comprises:
one or more n-type wells in the p-type doped semiconductor; wherein each of the photodiodes is made from a photodiode junction between the p-type doped semiconductor and one of the n-type wells.

7. The device structure of claim 5, wherein the light sensors are photodiodes and the detector array further comprises:
one or more $n^+$-type implants in the p-type doped semiconductor, wherein each of the photodiodes is made from a photodiode junction between the p-type doped semiconductor and one of the $n^+$-implants.

8. The device structure of claim 5, wherein a doping difference between the p-type well and the p-type doped semiconductor creates an electric field at a junction between the p-type doped semiconductor and the p-well that repels electrons created in the p-type doped semiconductor, preventing the electrons from being collected by n-type regions of the transistor.

9. The device structure of claim 1, wherein:
a pitch of the pixels is smaller than a bond pitch of the interconnects.

10. The device structure of claim 1, wherein:
the device structure forms a Hybrid Imager,
the ROIC is behind the detector array, and
the ROIC comprises signal and control processing but no buffer, reset, or select transistors.

11. A method of fabricating a device structure, comprising:
fabricating a first chip comprising a detector array, the detector array comprising a plurality of pixels disposed in rows and columns, each of the pixels including a light sensor and transistors, and the transistors comprising a buffer transistor, a select transistor, and a reset transistor;

forming interconnects having a number corresponding to less than one of the interconnects per light sensor, including:
one or more reset interconnects including one reset interconnect per row of pixels, wherein the reset transistors in a same row are connected to a same one of the reset interconnects;
one or more select interconnects including one select interconnect per row of pixels, wherein the select transistors in a same row are connected to a same one of the select interconnects;
one or more common column interconnects including one common column interconnect per column of pixels, wherein one or more outputs of the select transistors in a same column are connected to a same one of the common column interconnects; and
interconnecting a second chip with the first chip using the interconnects, the second chip comprising a Read Out Integrated Circuit (ROIC) that reads out one or more signals produced by the light sensors.

12. The method of claim 11, wherein the device structure is an imager.

13. The method of claim 11, further comprising fabricating the detector array to suppress or prevent collection of signal charge by the transistors prior to collection of the signal charge by the light sensors.

14. The method of claim 11, wherein fabricating the detector array further comprises:
fabricating one or more p-type wells in a p-type doped semiconductor, wherein:
the p-type wells are more highly p-type doped than the surrounding p-type doped semiconductor; and
each of the transistors is formed in one of the p-type wells.

15. The method of claim 14, wherein the light sensors are photodiodes and fabricating the detector array further comprises:
fabricating one or more n-type wells in the p-type doped semiconductor; wherein each of the photodiodes is made from a photodiode junction between the p-type doped semiconductor and one of the n-type wells.

16. The method of claim 14, wherein the light sensors are photodiodes and fabricating the detector array further comprises:
fabricating one or more $n^+$-type implants in the p-type doped semiconductor, wherein each of the photodiodes is made from a photodiode junction between the p-type doped semiconductor and one of the $n^+$-implants.

17. The method of claim 14, wherein a doping difference between the p-type well and the p-type semiconductor creates an electric field at a junction between the p-type doped semiconductor and the p-well that repels electrons created in the p-type doped semiconductor, preventing the electrons from being collected by n-type regions of the transistor.

18. The method of claim 11, further comprising fabricating a pitch of the pixels that is smaller than a bond pitch of the interconnects.

19. The method of claim 11, further comprising:
forming the ROIC behind the detector array and wherein the device structure forms a Hybrid Imager.

* * * * *